United States Patent [19]

Mohri et al.

[11] 4,396,682

[45] Aug. 2, 1983

[54] GLAZED CERAMIC SUBSTRATE

[75] Inventors: Yoshio Mohri; Tsutomu Ikeda; Takashi Hiroishi; Kinzi Sano; Yasuhiro Yamamoto; Yuji Yamamoto; Ryoji Nakashima, all of Matsusaka, Japan

[73] Assignee: Central Glass Company, Limited, Ube, Japan

[21] Appl. No.: 333,402

[22] Filed: Dec. 22, 1981

[30] Foreign Application Priority Data

Dec. 27, 1980 [JP] Japan ................................ 55-188236

[51] Int. Cl.$^3$ ................................................ B32B 9/00
[52] U.S. Cl. ..................................... 428/428; 428/427; 428/432; 501/67
[58] Field of Search ........................... 428/428, 427; 501/21-26, 70, 67

[56] References Cited

U.S. PATENT DOCUMENTS 3,497,336 12/1970 Simmons ............................ 501/67
3,923,528 11/1975 Kume ................................. 501/67
4,287,260 9/1981 Prall .................................... 428/428

FOREIGN PATENT DOCUMENTS 1000073 8/1965 United Kingdom .
612907 6/1978 U.S.S.R. .............................. 501/67

OTHER PUBLICATIONS

Schmidt-Voss, "Die Rohstoffe zur Glaserzeugung", (The Raw Materials for the Production of Glass), 2nd Edition, Leipzig, 1958, p. 243.

Primary Examiner—George F. Lesmes
Assistant Examiner—B. K. Johnson
Attorney, Agent, or Firm—Fleit, Jacobson & Cohn

[57] ABSTRACT

A glazed ceramic substrate for use in electric or electronic devices, obtained by forming a glass coating layer directly on a major surface of a ceramic substrate such as an alumina substrate. The glass as the material of the coating layer contains 50–60 Wt % of $SiO_2$, 10–30 Wt % of $Al_2O_3$, 15–30 Wt % of CaO and MgO, and 2–6 Wt % of $ZrO_2$ as essential components, optionally with the addition of small amount(s) of at least one of $TiO_2$, BaO, ZnO, PbO, $P_2O_5$, $B_2O_3$, $Na_2O$ and $K_2O$. The coating layer formed of this glass is excellent in its high-temperature stability, so that the glazed ceramic substrate is particularly suitable for use in thermal heads of thermal printing devices.

6 Claims, No Drawings

GLAZED CERAMIC SUBSTRATE

BACKGROUND OF THE INVENTION

This invention relates to a so-called glazed ceramic substrate, which is obtained by forming a glass coating layer on a ceramic substrate and is of use in electric or electronic devices.

Recently there has been an increasing trend to glaze a major surface of a ceramic plate, such as alumina plate, in order to provide a very smooth surface to the ceramic plate and utilize the glazed ceramic plate as a substrate of an electric or electronic device. A ceramic substrate having a glass coating is commonly called a glazed ceramic substrate. As to the material of the glass coating layer, it has been prevailing to use a sort of lead glass of which principal components are $SiO_2$ and PbO. Particularly there is an increasing trend of using glazed ceramic substrates for maufacturing hybrid integrated circuits, thermal heads of thermal printers or facsimile receivers.

In the recent thermal printers including those installed on the printing devices in facsimiles, still there is a demand for improvements in both the resolving power and the picture-producing speed of the thermal heads. To meet such a demand there is the need of further reducing the size of each heating element in the thermal heads and, besides, raising the heating temperature. Such modifications in the fundamentals of a thermal head inevitably result in an increase in the amount of heat generated per unit area of the substrate. In the case of a glazed ceramic substrate, therefore, an enhanced stability at high temperatures is required to the glass forming the coating layer. However, the aforementioned $SiO_2$-PbO base glass is insufficient in its high temperature stabiity when evaluated as the coating material of the substrate of a high-performance thermal head. In practice, the insufficiency of high temperature stability of the glass takes shape in softening, cracking or crystallization of the glass coating layer.

The glass coating layer of a glazed ceramic substrate is required to be high also in resistance to chemicals, because the interconnections between the circuit elements to be mounted on the substrate are formed by partly removing a thin film of metal deposited on the surface of the substrate by chemical etching after the formation of a patterned film of photoresist as a mask so as to leave desirably patterned conduction paths. However, the aforementioned lead glass is not fully satisfactory in its resistance to chemicals.

SUMMARY OF THE INVENTION

It is an object of the present invention to provide a glazed ceramic substrate, which has a glass coating layer excellent in high-temperature stability and sufficiently high in resistance to chemicals and accordingly is useful even for a high-performance thermal head of a thermal printing device.

A glazed ceramic substrate according to the invention comprises a plate-shaped body of a ceramic material and a glass coating layer formed directly on a major surface of the ceramic body. As the principal feature of the invention, the glass as the material of the coating layer comprises 50 to 60% by weight of $SiO_2$, 10 to 30% by weight of $Al_2O_3$, 15 to 30% by weight of CaO and MgO which are jointly used, and 2 to 6% by weight of $ZrO_2$ as essential components thereof.

Optionally, at least one of $TiO_2$, BaO, ZnO, PbO, $P_2O_5$, $B_2O_3$, $Na_2O$ and $K_2O$ may be added to the above specified essential components of the glass for the purpose of somewhat modifying certain properties of the glass.

The glass employed in this invention is very high in transition point. Accordingly, a glazed ceramic substrate of the invention is superior in high-temperature stability. Besides, this glass coating layer is highly resistant to chemicals and can be formed with high smoothness of its surface. Therefore, a glazed ceramic substrate of the invention is quite suitable for use in various electric or electronic devices such as hybrid integrated circuits, thermal heads of thermal printers or facsimiles, and is fully practicable even in a high-performance thermal head in which the substrate surface is subjected to intense heating.

DESCRIPTION OF THE PREFERRED EMBODIMENTS

The ceramic body of a glazed ceramic substrate according to the invention can be selected from conventional ceramic plates prepared as ceramic substrates for electric or electronic devices. By way of example, alumina, beryllia, magnesia, steatite, forsterite and zirconia can be named as useful ceramic materials.

As stated above, the essential components of the glass composition employed as the glazing material in the present invention are 50 to 60% of $SiO_2$, 10 to 30% of $Al_2O_3$, 15 to 30% of CaO and MgO, and 2 to 6% of $ZrO_2$, all by weight. For these essential components of the glass, the upper and lower boundaries of their respective amounts have been determined on the following grounds. In the following description the percentages of the materials are given always by weight.

$SiO_2$ serves as a basic component of the glass, and the transition point which represents the high-temperature stability of the glass forming the coating layer in the present invention can be raised by using a relatively large amount of $SiO_2$. To realize a high-temperature stability required to glazed ceramic substrates for use in high-performance thermal heads, the glass as the glazing material needs to contain at least 50% of $SiO_2$. However, the upper limit of the content of $SiO_2$ is set at 60% because the presence of a larger amount of $SiO_2$ is unfavorable for vitrification of a composition containing considerable amounts of $Al_2O_3$ and CaO.

$Al_2O_3$ has the effect of enhancing the affinity of the glass with the ceramic body to be coated, and this effect is practically appreciable when the glass contains at least 10% of $Al_2O_3$. However, the viscosity of the glass in molten state becomes higher as the amount of $Al_2O_3$ is increased, and this results in degradation of the surface smoothness of the glass coating layer obtained by solidification of a molten glass layer. Besides, the coexistance of an excessively large amount of $Al_2O_3$ with $SiO_2$ and CaO offers difficulty to vitrification. With consideration of these tendencies the upper limit of the content of $Al_2O_3$ is set at 30%, but in most cases it is suitable to limit the content of $Al_2O_3$ within the range from 10 to 20%.

CaO and MgO have the effect of lowering the viscosity of the glass and therefore enhancing the surface smoothness of the glass coating layer. Furthermore, these two oxides have the effect of expanding the vitrifiable range of the glass composition and suppressing crystallization. To fully gain these favorable effects, the total amount of CaO and MgO in the glass composition should be at least 15%. However, it is undesirable to increase the total amount of CaO and MgO beyond 30% because it results in lowering of the high temperature stability of the glass. These two oxides are used jointly.

$ZrO_2$ has an important effect of greatly raising the transition point of the glass composition. Besides, $ZrO_2$ has the effect of increasing the specific volume of the glass heated to relatively high temperatures and, hence, rendering the coefficient of thermal expansion of the glass coating layer close to that of the ceramic body. These effects become practically appreciable when the content of $ZrO_2$ in the glass reaches 2%. Furthermore, the presence of an adequate amount of $ZrO_2$ makes it possible to increase the total amount of CaO and MgO up to 30% without sacrificing the high temperature stability of the glass. However, the upper limit of the content of $ZrO_2$ is set at 6% because the presence of a larger amount of $ZrO_2$ constitutes an obstacle to the enhancement of the surface smoothness of the glass coating layer as the effect of CaO and MgO.

It is optional to add at least one of $TiO_2$, BaO, ZnO, PbO, $P_2O_5$, $B_2O_3$, $Na_2O$ and $K_2O$ to the above described essential components of the glass in order to improve the surface characteristics of the glass coating layer, to expand the vitrifiable range of the composition and/or to lower the viscosity of the glass in molten state. However, these auxiliary components should be incorporated only in relatively small amounts because they have unfavorable effects on the transition point and/or electric characteristics of the glass. It is preferred that the total content of these auxiliary oxides in the glass composition is not greater than 10%. Among these oxides, $Na_2O$ and $K_2O$ are particularly effective for lowering of the viscosity of the glass in molten state and, hence, for enhancement of the surface smoothness of the glass coating layer, but these two oxides unfavorably degrade the electric characteristics of the glass. Therefore, it is preferred that the total amount of $Na_2O$ and/or $K_2O$ in the glass composition does not exceed 4%.

A glazed ceramic substrate of the invention can be produced by utilizing a known method of forming a glass layer on a major surface of a ceramic substrate. For example, the glass in molten state may be applied onto the surface of the plate-shaped ceramic body by spraying, or a "green" sheet containing a powdered glass may be placed on the ceramic body and fired. From an industrial point of view, however, it will be more profitable to use a printing-firing method in which the glass in the form of paste is applied to the surface of the ceramic body paste by utilizing the technique of screen-printing and then melted by firing of the paste-applied body.

EXAMPLE

A granulated glass composed of 56 parts by weight of $SiO_2$, 14 parts by weight of $Al_2O_3$, 22 parts by weight of CaO, 2 parts by weight of MgO, 4 parts by weight of $ZrO_2$ and 2 parts by weight of $B_2O_3$ was prepared by mixing the raw materials in powder form, melting the mixture, cooling the molten mixture to solidify and pulverizing the solidified glass. The glass was further pulverized in a ball mill and classified to obtain a fine powder, in which most of the particles were 2 to 20 μm in particle size. A paste was prepared by mixing and kneading 100 parts by weight of the finely powdered glass with a solution of 1.5 parts by weight of ethyl cellulose in 50 parts by weight of terpineol.

The glass frit paste was applied onto a major surface of an alumina plate 100 mm × 300 mm wide and 1.5 mm thick by screen-printing to form a paste layer with a uniform thickness, and the paste layer was dried at about 100° C. for 1 hr to evaporate the terpineol contained in the paste. Then the paste-applied alumina plate was heated in air to a temperature of 1400° C. and maintained at this temperature for 2 hr to result in that the surface of the alumina plate was uniformly coated with a molten glass layer. The fired plate was left to cool down to room temperature to result in that the molten glass layer turned into a solid glass coating layer. At the screen-printing step the thickness of the paste layer was controlled such that the solidified glass coating layer had a thickness of 100 μm.

In the glazed ceramic substrate produced in this way, the transition point of the glass as the coating material was 770° C. This value can be taken as a remarkably high value considering that the transition points of conventional glass coating layers in glazed ceramic substrates are about 500° C. when produced for use in hybrid integrated circuits and 600°–650° C. even when produced for use in thermal heads for thermal printing devices. Accordingly this glazed ceramic substrate was excellent in high-temperature stability of the glass coating layer and was evaluated as suitable for a high-performance thermal head. The glass coating layer was highly resistant to chemicals, too.

What is claimed is:
1. A glazed ceramic substrate comprising:
a plate-shaped body of a ceramic material; and
a glass coating layer formed directly on a major surface of said body, the glass which constitutes said coating layer comprising 50 to 60% by weight of $SiO_2$, 10 to 30% by weight of $Al_2O_3$, 15 to 30% by weight of CaO and MgO which are jointly used, and 2 to 6% by weight of $ZrO_2$ as essential components thereof.

2. A glazed ceramic substrate according to claim 1, wherein said glass further comprises at least one auxiliary component selected from the group consisting of $TiO_2$, BaO, ZnO, PbO, $P_2O_5$, $B_2O_3$, $Na_2O$ and $K_2O$.

3. A glazed ceramic substrate according to claim 2, wherein the total content of said at least one auxiliary component in said glass is not greater than 10% by weight.

4. A glazed ceramic substrate according to claim 3, wherein the total content of said $Na_2O$ and $K_2O$ in said glass is not greater than 4% by weight.

5. A glazed ceramic substrate according to claim 1 or 2, wherein the content of $Al_2O_3$ in said glass is in the range from 10 to 20% by weight.

6. A glazed ceramic substrate according to claim 1, wherein said ceramic material is selected from the group consisting of alumina, beryllia, magnesia, steatite, forsterite and zirconia.

* * * * *